(12) United States Patent
Kim

(10) Patent No.: US 6,188,336 B1
(45) Date of Patent: Feb. 13, 2001

(54) 7/13 CHANNEL CODING AND DECODING METHOD USING RLL(2,25) CODE

(75) Inventor: Myoung-June Kim, Suwon (KR)

(73) Assignee: Samsung Electronics, Co., Ltd., Suwon (KR)

(*) Notice: Under 35 U.S.C. 154(b), the term of this patent shall be extended for 0 days.

(21) Appl. No.: 09/196,108

(22) Filed: Nov. 20, 1998

(30) Foreign Application Priority Data

Nov. 21, 1997 (KR) .................................................. 97-61789

(51) Int. Cl.⁷ ...................................................... H03M 7/46
(52) U.S. Cl. ............................................................. 341/59
(58) Field of Search ................................................. 341/59

(56) References Cited

U.S. PATENT DOCUMENTS

| | | | | |
|---|---|---|---|---|
| 5,767,798 | * | 6/1998 | Won | 341/59 |
| 5,844,508 | * | 12/1998 | Murashita et al. | 341/51 |
| 5,870,037 | * | 2/1999 | Okazaki et al. | 341/58 |

FOREIGN PATENT DOCUMENTS

| | | |
|---|---|---|
| 2 304 260 | 3/1997 | (GB) . |
| 48-7641 | 1/1973 | (JP) . |
| 61-230679 | 10/1986 | (JP) . |
| 3-145334 | 6/1991 | (JP) . |

* cited by examiner

Primary Examiner—Brian Young
(74) Attorney, Agent, or Firm—Staas & Halsey LLP

(57) ABSTRACT

A channel coding method for channel-coding digital data includes the steps of (a) inputting 7-bit data, and (b) coding the input 7-bit data into 13-bit channel data with reference to at least one run length limited RLL(2,25) code table, where the minimum run length is 2 and the maximum run length is 25. A channel decoding method for channel-decoding channel-coded digital data includes the steps of (a) inputting 13-bit channel data, and (b) decoding the input 13-bit channel data into the prior-to-being-coded 7-bit data with reference to at least one run length limited RLL(2,25) code table, where the minimum run length is 2 and the maximum run length is 25. The code tables comprised of the RLL(2,25) codes include a main code table and sub-code tables. The channel coding and decoding method enables a high-density in a recording medium and real-time processing of the system during transmission and recording/reproduction of digital data.

16 Claims, 4 Drawing Sheets

FIG. 1

(CODE VALUES ARE EXPRESSED AS HEXADECIMAL NOTATION)

| INPUT DATA | CA | CB | CC | INPUT DATA | CA | CB | CC | INPUT DATA | CA | CB | CC |
|---|---|---|---|---|---|---|---|---|---|---|---|
| 0 | 2 | 1 | | 43 | 408 | | | 86 | 924 | | |
| 1 | 4 | | | 44 | 410 | | | 87 | 1000 | | 0 |
| 2 | 8 | | | 45 | 412 | 209 | | 88 | 1002 | 801 | 4 |
| 3 | 10 | | | 46 | 420 | | | 89 | 1004 | | 8 |
| 4 | 12 | 9 | | 47 | 422 | 211 | | 90 | 1008 | | 10 |
| 5 | 20 | | | 48 | 424 | | | 91 | 1010 | | 20 |
| 6 | 22 | 11 | | 49 | 440 | | | 92 | 1012 | 809 | 24 |
| 7 | 24 | | | 50 | 442 | 221 | | 93 | 1020 | | 40 |
| 8 | 40 | | | 51 | 444 | | | 94 | 1022 | 811 | 44 |
| 9 | 42 | 21 | | 52 | 448 | | | 95 | 1024 | | 48 |
| 10 | 44 | | | 53 | 480 | | | 96 | 1040 | | 80 |
| 11 | 48 | | | 54 | 482 | 241 | | 97 | 1042 | 821 | 84 |
| 12 | 80 | | | 55 | 484 | | | 98 | 1044 | | 88 |
| 13 | 82 | 41 | | 56 | 488 | | | 99 | 1048 | | 90 |
| 14 | 84 | | | 57 | 490 | | | 100 | 1080 | | 100 |
| 15 | 88 | | | 58 | 492 | 249 | | 101 | 1082 | 841 | 104 |
| 16 | 90 | | | 59 | 800 | | | 102 | 1084 | | 108 |
| 17 | 92 | 49 | | 60 | 802 | 401 | | 103 | 1088 | | 110 |
| 18 | 100 | | | 61 | 804 | | | 104 | 1090 | | 120 |
| 19 | 102 | 81 | | 62 | 808 | | | 105 | 1092 | 849 | 124 |
| 20 | 104 | | | 63 | 810 | | | 106 | 1100 | | 200 |
| 21 | 108 | | | 64 | 812 | 409 | | 107 | 1102 | 881 | 204 |
| 22 | 110 | | | 65 | 820 | | | 108 | 1104 | | 208 |
| 23 | 112 | 89 | | 66 | 822 | 411 | | 109 | 1108 | | 210 |
| 24 | 120 | | | 67 | 824 | | | 110 | 1110 | | 220 |
| 25 | 122 | 91 | | 68 | 840 | | | 111 | 1112 | 889 | 224 |
| 26 | 124 | | | 69 | 842 | 421 | | 112 | 1120 | | 240 |
| 27 | 200 | | | 70 | 844 | | | 113 | 1122 | 891 | 244 |
| 28 | 202 | 101 | | 71 | 848 | | | 114 | 1124 | | 248 |
| 29 | 204 | | | 72 | 880 | | | 115 | 1200 | | 400 |
| 30 | 208 | | | 73 | 882 | 441 | | 116 | 1202 | 901 | 404 |
| 31 | 210 | | | 74 | 884 | | | 117 | 1204 | | 408 |
| 32 | 212 | 109 | | 75 | 888 | | | 118 | 1208 | | 410 |
| 33 | 220 | | | 76 | 890 | | | 119 | 1210 | | 420 |
| 34 | 222 | 111 | | 77 | 892 | 449 | | 120 | 1212 | 909 | 424 |
| 35 | 224 | | | 78 | 900 | | | 121 | 1220 | | 440 |
| 36 | 240 | | | 79 | 902 | 481 | | 122 | 1222 | 911 | 444 |
| 37 | 242 | 121 | | 80 | 904 | | | 123 | 1224 | | 448 |
| 38 | 244 | | | 81 | 908 | | | 124 | 1240 | | 480 |
| 39 | 248 | | | 82 | 910 | | | 125 | 1242 | 921 | 484 |
| 40 | 400 | | | 83 | 912 | 489 | | 126 | 1244 | | 488 |
| 41 | 402 | 201 | | 84 | 920 | | | 127 | 1248 | | 490 |
| 42 | 404 | | | 85 | 922 | 491 | | | | | |

FIG. 2

| GROUP | GROUP 1 | GROUP 2 |
|---|---|---|
| MEMBER | 0, 4, 6, 9, 13, 17, 19, 23, 25, 28, 32, 34, 37, 41, 45, 47, 50, 54, 58, 60, 64, 66, 69, 73, 77, 79, 83, 85, 88, 92, 94, 97, 101, 105, 107, 111, 113, 116, 120, 122, 125 | 87 ~ 127 |
| CORRESPONDING CODE | CODE A, CODE B | CODE A, CODE C |

7/13 CHANNEL CODING AND DECODING METHOD USING RLL(2,25) CODE

CROSS-REFERENCE TO RELATED APPLICATIONS

This application claims the benefit of Korean Application No. 97-61789, filed Nov. 21, 1997, in the Korean Patent Office, the disclosure of which is incorporated herein by reference.

BACKGROUND OF THE INVENTION

1. Field of the Invention

The present invention relates to a method for channel coding 7 input data bits into 13 channel data bits and channel decoding the channel-coded 13 channel data bits into the prior-to-channel-coding 7 data bits, using a run-length-limited (RLL) (2,25) code during transmission and recording/reproduction of digital data.

2. Description of the Related Art

Channel coding converts digital data so that it is adapted to the feature of a transmission medium or a recording medium, in order to transmit or record the digital data under optimal conditions, which is also called channel modulation. The RLL channel coding method is chiefly used as a channel coding method for recording digital data on a recording medium such as an optical disk. The RLL channel coding method channel codes m-bit input data into n-bit channel data, so that the length of a successive zero run satisfies a (d,k) condition, which is expressed as (d,k,m,n;l) or RLL (d,k). Here, d denotes the minimum length of the successive zero run (hereinafter, referred to as minimum run length), k denotes the maximum length of the successive zero run (hereinafter, referred to as maximum run length), m denotes the number of minimum unit input bits, and n denotes the number of minimum unit channel bits. Also, when digital data is variably input, the number of maximum unit input bits is denoted by l. For example, when input data is varied among m, 2 m, 3 m and 4 m, l is 4 m. A recording density ratio (DR) of the RLL channel coding method is defined as $$DR = \frac{m}{n}(d+1).$$

Here, $$\frac{m}{n}$$

represents a conversion ratio when m-bit input data is converted into n-bit channel data, and (d+1) represents a minimum interval of time. Thus, the conversion ratio and/or the minimum interval of time should be increased in order to increase a recording density ratio.

Different types of the RLL channel coding method are an Eight-To-Fourteen (EMF) method, an RLL(2,7) method, an RLL(1,7) method, and an EFM-plus method. The EFM method where (d,k,m,n) is (2,10,8,17) is a channel coding method proposed by Philips Co. Ltd. which is chiefly used in a compact disk (CD). The EFM method converts 8-bit input data into 14-bit channel data. However, since the EFM method additionally requires three merging bits for controlling a digital sum value (DSV), the conversion ratio is decreased to $$\frac{8}{17},$$

the minimum interval of time becomes 3T, and the recording density ratio becomes 1.41. Meanwhile, the EFM method is not appropriate for a high-density optical disk requiring a real-time processing because of a large size of a code book for channel coding and decoding. In the RLL(2,7) method where (d,k,m,n) is (2,7,1,2), the conversion ratio is 0.5, the minimum interval of time becomes 3T, and the recording density ratio becomes 1.5, which is chiefly used in a magneto-optical disk (MOD). In the RLL(1,7) method where (d,k,m,n) is (1,7,2,3), the conversion ratio is 0.67, the minimum interval of time becomes 2T, and the recording density ratio becomes 1.33, which is chiefly used in a 4-times capacity (4×) magneto-optical disk (4×MOD). In the EFM-plus method improving the EFM method where (d,k,m,n) is (2,10,8,16), the conversion ratio is 0.5, the minimum interval of time becomes 3T, and the recording density ratio becomes 1.5, which is chiefly used in a digital versatile disk (DVD). The above-described conventional RLL channel coding methods are summarized in the following Table 1.

TABLE 1

| modulation type | EFM | RLL(2, 7) | RLL(1, 7) | EFM-plus |
| --- | --- | --- | --- | --- |
| (d, k, m, n) | (2, 10, 8, 17) | (2, 7, 1, 2) | (1, 7, 2, 3) | (2, 10, 8, 16) |
| conversion ratio | 0.47 | 0.5 | 0.67 | 0.5 |
| recording density ratio | 1.41 | 1.5 | 1.33 | 1.5 |
| application field | CD | MOD | 4X MOD | DVD |

However, when the minimum run length is 2 among the above channel coding methods, 16 or 17 channel data bits are required with respect to 8 input data bits. Thus, the conversion ratio is lowered and the recording density ratio is not improved. Also, in the RLL(1,7) method where the minimum run length is 1, 8 input data bits are converted into 12 channel data bits, with a result that the conversion ratio is increased. However, the minimum interval of time is 2T and the recording density ratio is only about 1.33, which causes a lower recording density ratio than those of the other methods.

SUMMARY OF THE INVENTION

To solve the above problems, it is an object of the present invention to provide a channel coding method having a higher conversion ratio and recording density ratio compared to conventional RLL coding methods during transmission and recording/reproduction of digital data.

It is another object of the present invention to provide a channel decoding method for accurately restoring the data coded by the above channel coding method into the prior-to-channel-coded data during channel reception and reproduction of digital data.

Additional objects and advantages of the invention will be set forth in part in the description which follows and, in part, will be obvious from the description, or may be learned by practice of the invention.

To accomplish the above and other objects and advantages of the present invention, there is provided a channel coding method including the steps of: (a) inputting 7-bit data; and (b) coding the input 7-bit data into 13-bit channel data with reference to at least one run length limited RLL (2,25) code table, where the minimum run length is 2 and the maximum run length is 25.

To further accomplish the above and other objects and advantages of the present invention, there is provided a channel decoding method including the steps of: (a) inputting 13-bit channel data; and (b) decoding the input 13-bit channel data into the prior-to-being-coded 7-bit data with reference to at least one run length limited RLL(2,25) code table, where the minimum run length is 2 and the maximum run length is 25.

BRIEF DESCRIPTION OF THE DRAWINGS

These and other objects and advantages of the invention will become apparent and more readily appreciated from the following description of the preferred embodiment, taken in conjunction with the accompanying drawings of which:

FIG. 1 shows RLL(2,25) code tables for channel coding and decoding according to an embodiment of the present invention.

FIG. 2 shows groups for judging whether or not the minimum run length limited rule is violated during channel coding with reference to a main code table among the code tables shown in FIG. 1.

DETAILED DESCRIPTION OF THE PREFERRED EMBODIMENT

Figure 3:
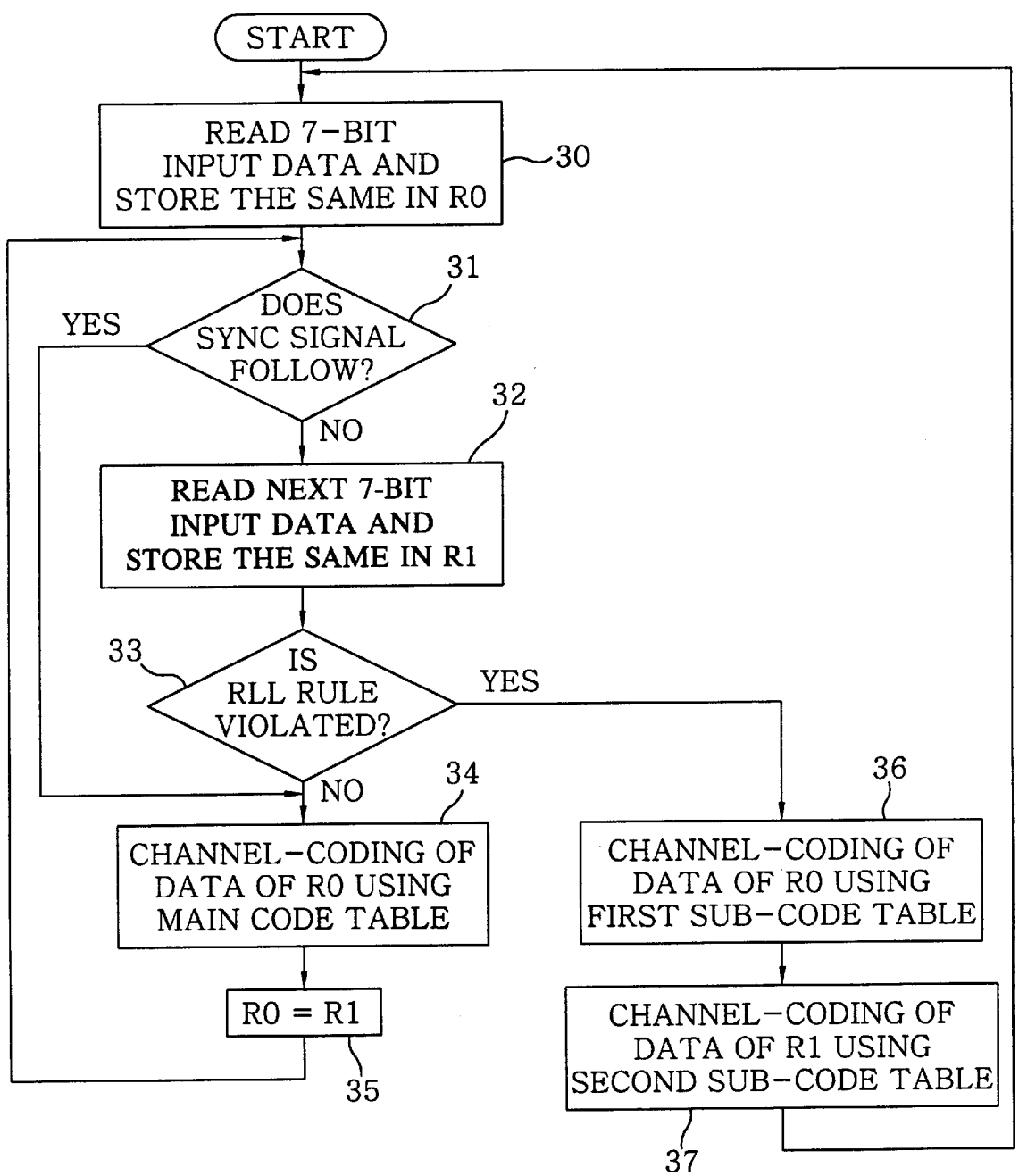
FIG. 3 is a flow chart view illustrating a channel coding method according to the embodiment of the present invention.

Reference will now made in detail to the present preferred embodiment of the present invention, examples of which are illustrated in the accompanying drawings, wherein like reference numerals refer to the like elements throughout. The embodiments are described below in order to explain the present invention by referring to the figures.

First, each of RLL(2,25) codes for use in a channel coding and decoding method according to an embodiment of the present invention has a minimum run length of 2 and a maximum run length of 25 when 7-bit input data is converted into 13-bit channel data. In case of at least one code table comprised of the above RLL(2,25) codes, 13-bit channel data satisfying the RLL(2,25) condition among the 13-bit channel data having a data pattern of $2^{13}$ is mapped on 7-bit input data having a data pattern of $2^7$, respectively. FIG. 1 shows a preferred embodiment of the above code tables. Referring to FIG. 1, there are three code tables CA (code A table), CB (code B table) and CC (code C table). Here, the CA table is a main code table where 13-bit channel data is mapped on each 7-bit input data pattern. The CB table and CC table are two sub-code tables each having 41 codes, in order to prevent the minimum run length limited rule from being violated when a channel coding is performed by only a main code table. By reference, code values for 13-bit channel data (code values) shown in FIG. 1 are expressed as hexadecimal numbers. In the main code table CA, a data pattern of $2^7$ corresponding to 7-bit input data among the data patterns of $2^{13}$ for 13-bit channel data is extracted, in which case only a data pattern having the minimum run length of 2 and the maximum run length of 25 is extracted. In the sub-code tables comprised of the RLL(2,25) codes, the first sub-code table CB is comprised of 13-bit channel data whose least significant bit (LSB) is "1" and the second sub-code table CC is comprised of 13-bit channel data whose two uppermost bits and two lowermost bits are "00," respectively.

FIG. 2 shows groups for judging whether or not the minimum run length limited rule is violated in successive 26-bit channel data during channel coding with reference to codes of the main code table CA among the code tables shown in FIG. 1. Referring to FIG. 2, a group 1 is a collection of input data patterns corresponding to the cases where the lowermost bits are "10" among the 13-bit channel data in the main code CA table shown in FIG. 1. A group 2 is a collection of input data patterns corresponding to the cases where the most significant bit is "1" among the 13-bit channel data in the main code table CA. Thus, when input data is channel coded with only a main code table, if the input data belonging to the group 1 is input and the input data belonging to the group 2 is successively input, the channel-coded 26-bit channel data becomes a data stream of "XXXXXXXXXXX101XXXXXXXXXXXXX" and the minimum run length becomes 1. As a result, the minimum run length limited rule where the minimum run length should be 2 in the RLL(2,25) channel coding method is violated.

Meanwhile, a channel coding method according to the embodiment of the present invention is a variable input data bit method. In more detail, in the case that the minimum run length limited rule is not violated, the 7-bit input data is channel coded into 13-bit channel data with reference to the main code table CA of FIG. 1. However, in the case that the minimum run length limited rule is violated among the successive 26-bit channel data, the first 7-bit input data among the 14-bit input data is channel coded into 13-bit channel data with reference to the first sub-code table, and the successive second 7-bit input data is channel coded into 13-bit channel data with reference to the second sub-code table, so that the minimum run length limited rule according to the RLL(2,25) method is not violated.

The channel coding method according to the embodiment of the present invention uses the RLL(2,25) code, in which the conversion ratio is 0.54, the minimum interval of time is 3T, and the recording density ratio is 1.62. Thus, the RLL(2,25) channel coding method according to the embodiment of the present invention provides the highest conversion ratio and recording density ratio among the channel coding methods having the minimum run length limited rule of 2.

Referring to the flow chart of FIG. 3 showing a 7/13 channel coding method using the RLL(2,25) code according to a preferred embodiment, a channel coding system reads first 7-bit input data among an input bit stream and stores the read result in a first register R0 (step 30). Then, the channel coding system judges whether or not the 7-bit input data is immediately followed by a sync signal (step 31). If it is judged that a sync signal exists, the 7-bit input data stored in the register R0 is channel coded into 13-bit channel data with reference to the main code table CA shown in FIG. 1 (step 34). Then, the operation returns to step 31 via step 35. If it is judged that a sync signal does not exist in step 31, the next 7-bit input data following the first 7-bit input data is read and the read next 7-bit input data is stored in a second register R1 (step 32). Then, the channel coding system judges whether or not the minimum run length limited rule is violated when the 14-bit input data stored in the registers R0 and R1 are channel coded into 26-bit channel data with reference to the main code table (step 33). Here, the channel coding system judges that the minimum run length limited rule has been violated if the 7-bit input data stored in the register R0 belongs to the group 1 shown in FIG. 2 and the 7-bit input data stored in the register R1 belongs to the group 2 shown in FIG. 2. The channel coding system channel-codes the first 7-bit input data of the register R0 into 13-bit channel data with reference to the main code table CA of FIG. 1 if it is judged that the minimum run length limited rule has not been violated in the judgment result (step 34), and then stores the 7-bit input data stored in the register R1 in the register R0 (step 35), to return to step 31. Meanwhile, the channel coding system channel-codes the first 7-bit input data stored in the register R0 into 13-bit channel data with reference to the first sub-code table CB of FIG. 1 if it is judged that the minimum run length limited rule has been violated in the judgment result (step 36), and then channel-codes the second 7-bit input data stored in the register R1 into the 13-bit channel data with reference to the second sub-code table CC of FIG. 1 (step 37), to then return to step 30.

Summarizing the channel coding method referring to FIG. 3, if a sync signal follows or the minimum run length limited rule is not violated, the 7-bit input data is channel-coded into the 13-bit channel data with reference to the main code table CA of FIG. 1, while if the minimum run length limited rule is violated, the 14-bit input data is channel-coded into the 26-bit channel data with reference to the above-described sub-code tables CB and CC. Accordingly, the 7/13 channel coding method using the RLL(2,25) code according to the present invention has a higher conversion ratio and recording density ratio than the conventional art during channel-transmission of digital data and recording thereof on an optical disk, to thereby enable a high-density of a recording medium and a real-time processing.

Figure 4:
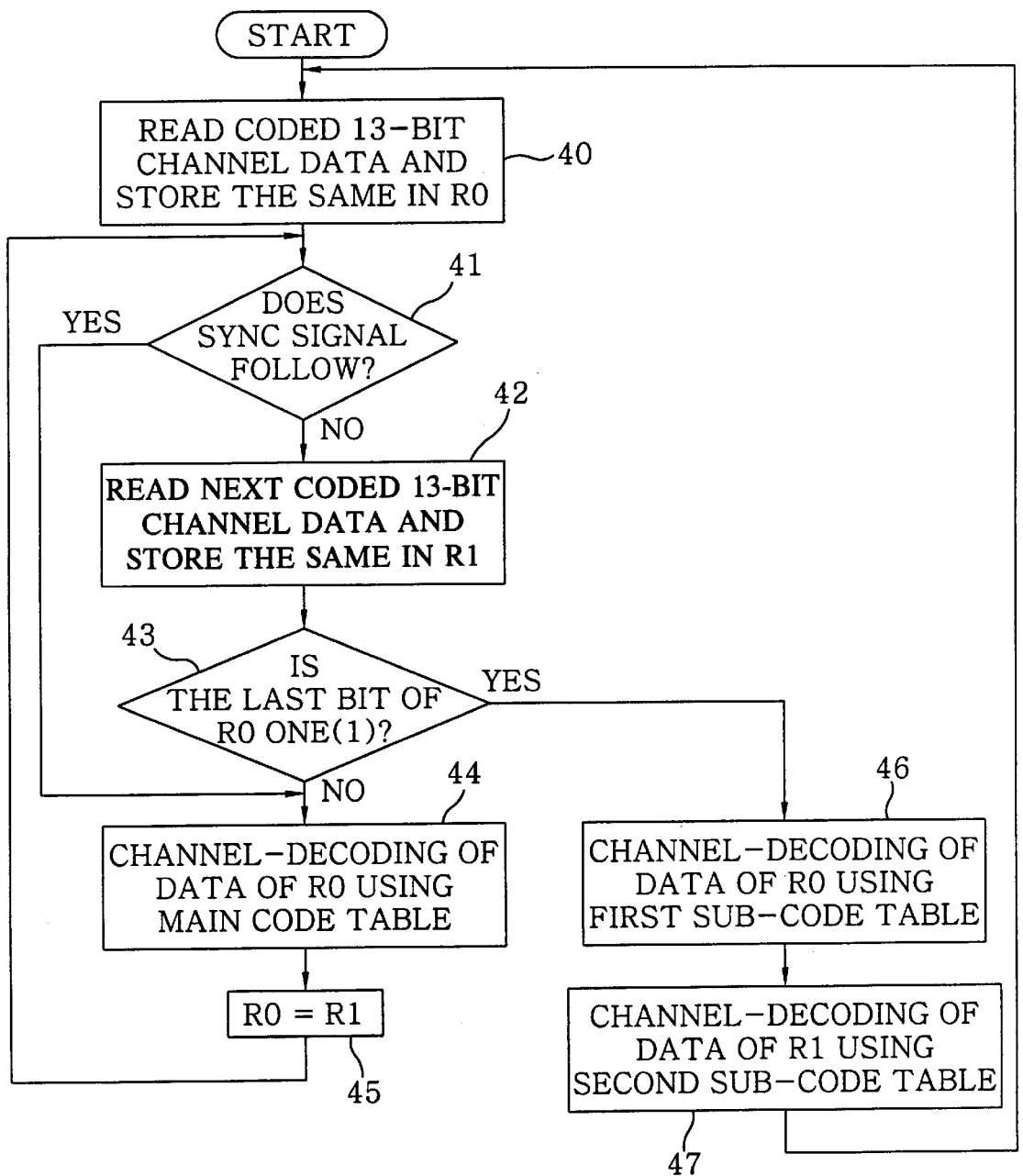
FIG. 4 is a flow chart view illustrating a channel decoding method according to the embodiment of the present invention.

Referring to FIG. 4 showing a channel decoding method according to the embodiment of the present invention, the channel decoding system first reads the 13-bit channel data among the bit streams which have been channel-coded according to the RLL(2,25) channel coding method and then received and reproduced and stores the read result in the first register R0 (step 40). Then, the channel decoding system judges whether or not the input 13-bit channel data is immediately followed by a sync signal (step 41).

If it is judged that a sync signal exists as a result of the judgment, the 13-bit channel data stored in the register R0 is channel-decoded into the prior-to-being-coded 7-bit data with reference to the main code table CA shown in FIG. 1 (step 44). Then, the operation returns to step 41 via step 45. If it is judged that a sync signal does not exist as a result of the judgment, the channel decoding system reads the next 13-bit channel data following the 13-bit channel data and stores the read next 13-bit channel data in a second register R1 (step 42). Then, the channel decoding system judges whether or not the 26-bit channel data stored in the registers R0 and R1 are channel-coded with reference to the sub-code tables (step 43). Here, in the case that the sub-code tables CB and CC are embodied as shown in FIG. 1, the LSB of the 13-bit channel data in the first sub-code table CB has a value of "1". As a result, the channel decoding system judges whether the channel coding of the sub-code tables CB and CC is performed by detecting the value of the LSB. That is, if R0&1=1, adopting the PASCAL language operator, it can be seen that the 13-bit channel data stored in the register R0 has been channel-coded with reference to the first sub-code table CB. If R0&1=0, it can be seen that the 13-bit channel data stored in the register R0 has been channel-coded with reference to the main code table CA. The channel decoding system channel-decodes the 13-bit channel data stored in the register R0 into the prior-to-being-coded 7-bit data with reference to the main code table CA if it is judged that the 13-bit channel data of the register R0 has been channel-coded by the main code table CA in the judgment result of step 43 (step 44), and then stores the 13-bit channel data stored in the register R1 in the register R0 (step 45), to return to step 41. Meanwhile, the channel decoding system channel-decodes the 13-bit channel data stored in the register R0 into the prior-to-being-coded 7-bit data with reference to the first sub-code table CB if it is judged that the 26-bit channel data stored in the registers R0 and R1 has been channel-coded by the sub-code tables CB and CC in the judgment result of the step 43 (step 46), and then channel-decodes the 13-bit channel data stored in the register R1 with reference to the second sub-code table CC into the prior-to-being-coded 7-bit data (step 47), to then return to step 40.

Summarizing the channel decoding method by referring to FIG. 4, if a sync signal follows or the channel data is not channel-coded by the sub-code tables CB and CC, the 13-bit channel data is channel-decoded into the prior-to-being-coded 7-bit data with reference to the main code table CA, while if the successive 14-bit input data is channel-coded into the 26-bit channel data with reference to the above-described sub-code tables CB and CC, the 26-bit channel data is channel-decoded into the prior-to-being-coded 14-bit data with reference to the sub-code tables CB and CC. Accordingly, the RLL(2,25) channel decoding method according to the present invention accurately channel-decodes the data according to the RLL(2,25) channel coding method into the prior-to-being-coded data without any errors and has a high conversion ratio and recording density ratio, to thereby enable a high-density of a recording medium and a real-time processing of the system.

Meanwhile, any one who has an ordinary skill in the art can embody various modifications and variations of the code tables of FIG. 1 for channel-coding the 7-bit input data into the 13-bit channel data and channel-decoding the channel-coded result into the original data, using the RLL(2,25) code. For example, code tables which do not violate the minimum run length limited rule and are different from the main code table CA as shown in FIG. 1 can be produced according to the RLL(2,25) code table generation rule. In this case, the sub-code tables are not required and any person skilled in the art can easily embody the 7/13 channel coding and decoding method using a modified main code table according to the RLL(2,25) code by properly modifying the FIGS. 3 and 4 flow chart views based on the technical concepts of the present invention.

As described above, the channel coding and decoding method according to the present invention channel-codes 7-bit input data into 13-bit channel data and channel-decodes the 13-bit channel data into the 7-bit input data with reference to the RLL(2,25) code where (d,k,m,n) is (2,25, 7,13). The channel coding and decoding method according to the present invention has a higher conversion ratio and recording density ratio than those of the conventional art. Thus, the present invention enables a high-density in a recording medium and real-time processing of the system during transmission and recording/reproduction of digital data.

While only certain embodiments of the invention have been specifically described herein, it will be apparent that numerous modifications may be made thereto without departing from the spirit and scope of the invention.

What is claimed is:

1. A channel coding method for channel-coding digital data, the channel coding method comprising the steps of:

(a) inputting 7-bit data; and
(b) coding the input 7-bit data into 13-bit channel data with reference to at least one run length limited RLL (2,25) code table each having RLL(2,25) codes, wherein a minimum run length is 2 and a maximum run length is 25.

2. The channel coding method according to claim 1, wherein said step (b) comprises the steps of:
(b1) judging whether the 7-bit input data is immediately followed by a sync signal;
(b2) if the judgment in said step (b1) is that the sync signal immediately follows the 7-bit input data, coding the 7-bit input data into the 13-bit channel data with reference to a main code table of the RLL(2,25) code tables, wherein the RLL(2,25) codes are mapped on each input data among the RLL(2,25) code tables;
(b3) if the judgment in said step (b1) is that the sync signal does not immediately follow the 7-bit input data, judging whether 14-bit input data, which includes the 7-bit data and next 7-bit input data following the 7-bit input data, violates a minimum run length limited rule when the 14-bit input data is channel-coded to 26-bit channel data using the main code table;
(b4) if the judgment in said step (b3) is that the minimum run length limited rule has not been violated, coding the 7-bit input data among the 14-bit input data into the 13-bit channel data with reference to the main code table; and
(b5) if the judgment in said step (b3) is that the minimum run length limited rule has been violated, coding the 14-bit input data into the 26-bit channel data with reference to at least one sub-code table of the RLL(2, 25) code tables for the 26-bit channel data which does not violate the minimum run length limited rule among the RLL(2,25) code tables.

3. The channel coding method according to claim 2, wherein said step (b3) comprises the step of judging that the minimum run length limited rule is violated if the 7-bit input data among the 14-bit input data belongs to a first group and the next 7-bit input data belongs to a second group, in which the first group comprises the RLL(2,25) codes of the 13-bit channel data whose lowermost two bits are "10" corresponding to the 7-bit input data among the RLL(2,25) codes in the main code table, and the second group comprises the RLL (2,25) codes of the 13-bit channel data whose most significant bit is "1" corresponding to the next 7-bit input data among the RLL(2,25) codes in the main code table.

4. The channel coding method according to claim 2, wherein:
said step (b5) comprises the step of coding the 7-bit input data among the 14-bit input data into the 13-bit channel data with reference to a first sub-code table among the sub-code tables, and coding the next 7-bit input data among the 14-bit input data into the 13-bit channel data with reference to a second sub-code table among the sub-code tables; and
the first sub-code table comprises the RLL(2,25) codes of the 13-bit channel data whose least significant bit is "1" corresponding to the 7-bit input data, and the second sub-code table comprises the RLL(2,25) codes of the 13-bit channel data whose two uppermost bits and two lowermost bits are "00," respectively.

5. The channel coding method as claimed in claim 2, wherein:
said step (a) comprises the step of storing the 7-bit data in a first register;

said step (b3) comprises the step of storing the next 7-bit data in a second register;
said step (b4) comprises the step of reading the 7-bit input data from the first register prior to the coding of the 7-bit input data;
said step (b5) comprises the step of reading the 7-bit input data from the first register and reading the next 7-bit input data from the second register prior to the coding of the 14-bit input data; and
the channel coding method further comprising the step of storing the next 7-bit data stored in the second register in the first register if the coding of the 7-bit input data among the 14-bit input data into the 13-bit channel data with reference to the main code table in said step (b4) is performed.

6. The channel coding method as claimed in claim 1, further comprising the step of:
(c) decoding the 13-bit channel data with reference to the at least one run length limited(2,25) code table.

7. A channel decoding method for channel-decoding channel-coded digital data, the channel decoding method comprising the steps of:
(a) inputting 13-bit channel data; and
(b) decoding the input 13-bit channel data into prior-to-being-coded 7-bit data with reference to at least one run length limited RLL(2,25) code table, wherein a minimum run length is 2 and a maximum run length is 25.

8. The channel decoding method according to claim 7, wherein said step (b) comprises the steps of:
(b1) judging whether the 13-bit channel data is immediately followed by a sync signal;
(b2) if the judgment in said step (b1) is that the sync signal immediately follows the 13-bit channel data, decoding the 13-bit channel data into the prior-to-being-coded 7-bit data with reference to a main code table of the RLL(2,25) code tables, wherein the RLL(2,25) codes are mapped on each input data among the RLL(2,25) code tables;
(b3) if the judgment in said step (b1) is that the sync signal does not immediately follow the 13-bit channel data, judging whether the 26-bit channel data, which includes the 13-bit channel and next 13-bit channel data following the 13-bit channel data, has been channel-coded using at least one sub-code table of the RLL(2, 25) code tables for the 26-bit channel data which does not violate the minimum run length limited rule among the RLL(2,25) code tables;
(b4) if the judgment in said step (b3) is that the channel-coding has not been performed using the sub-code tables, decoding the 13-bit channel data into the prior-to-being-coded 7-bit data with reference to the main code table; and
(b5) if the judgment in said step (b3) is that the channel-coding has been performed using the sub-code tables, decoding the 26-bit channel data into prior-to-being-coded 14-bit data with reference to the sub-code tables.

9. The channel decoding method according to claim 8, wherein said step (b3) comprises the step of judging that the 26-bit channel data has been channel-coded using the RLL (2,25) sub-code tables if a least significant bit of the 13-bit channel data among the input 26-bit channel data is "1," and judging that the 26-bit channel data has not been channel-coded using the RLL(2,25) sub-code tables if the least significant bit is "0."

10. The channel decoding method according to claim 8, wherein:

said step (b5) comprises the step of decoding the 13-bit channel data among the 26-bit channel data into the prior-to-being-coded 7-bit data with reference to a first sub-code table among the RLL(2,25) sub-code tables, and decoding the next 13-bit channel data among the 26-bit channel data into the prior-to-being-coded 7-bit data with reference to a second sub-code table among the RLL(2,25) sub-code tables; and the first sub-code table comprises the RLL(2,25) codes of the 13-bit channel data whose least significant bit is "1" corresponding to the 7-bit input data, and the second sub-code table comprises the RLL(2,25) codes of the 13-bit channel data whose two uppermost bits and two lowermost bits are "00," respectively.

11. The channel decoding method as claimed in claim 7, wherein:

said step (a) comprises the step of storing the 13-bit channel data in a first register;

said step (b3) comprises the step of storing the next 13-bit channel data in a second register;

said step (b4) comprises the step of reading the 13-bit channel data from the first register prior to the decoding of the 13-bit channel data;

said step (b5) comprises the step of reading the 13-bit channel data from the first register and reading the next 13-bit channel data from the second register prior to the decoding of the 26-bit channel data; and the channel decoding method further comprising the step of storing the next 13-bit channel data stored in the second register in the first register if the decoding of the 13-bit channel data into the prior-to-being coded 7-bit data with reference to the main code table in said step (b4) is performed.

12. A channel coding method for channel-coding digital data, comprising the steps of:

(a) receiving a plurality of 7-bit input data;

(b) determining whether a minimum run length is violated in response to first and second ones of the 7-bit input data being coded to successive 26-bit channel data of 13-bit channel data and next 13-bit channel data using a first run length limited RLL(2,25) code table having RLL(2,25) codes; and (c) coding the first 7-bit input data into the 13-bit channel data using the first run length limited RLL(2,25) code table if the minimum run length is not violated;

(d) coding the first 7-bit input data into the 13-bit channel data using a second run length limited RLL(2,25) code table having RLL (2,25) codes and the second 7-bit input data into the next 13-bit channel data using a third run length limited RLL(2,25) code table having RLL (2,25) codes, if the minimum run length is violated;

(e) receiving the 13-bit channel data and the next 13-bit channel data as first and second 13-bit channel data;

(f) determining whether 26-bit channel data of the first and second 13-bit channel data has been channel-coded using the second and third run length limited RLL(2, 25) code tables having RLL(2,25) codes for the first and second 13-bit channel data, respectively;

(g) decoding the first 13-bit input data into the prior-to-being coded 7-bit data using the first run length limited RLL(2,25) code table if the 26-bit channel data has not been channel-coded using the second and third run length limited RLL(2,25) code tables; and (h) decoding the first 13-bit input data into the prior-to-being coded 7-bit data using the second run length limited RLL(2,25) code table and the second 13-bit channel data into the prior-to-being coded next 7-bit data using the third run length limited RLL(2,25) code table, if the 26-bit channel data has been channel-coded using the second and third run length limited RLL(2, 25) code tables.

13. The channel coding method as claimed in claim 12, wherein said step (b) comprises the steps of:

determining whether the first 7-bit input data belongs to a first group of 7-bit data and whether the second 7-bit input data belongs to a second group of 7-bit data;

determining that the minimum run length is violated if the first 7-bit input data belongs to the first group of 7-bit data and the second 7-bit input data belongs to the second group of input data; and determining that the minimum run length is not violated if either the first 7-bit input data does not belong to the first group of 7-bit data or the second 7-bit input data does not belong to the second group of input data.

14. The channel coding method as claimed in claim 13, wherein the first group of 7-bit input data comprises RLL (2,25) codes of the 13-bit channel data whose lowermost two bits are "10" corresponding to the 7-bit input data among the RLL(2,25) codes in the first run length limited RLL(2,25) code table, and the second group of 7-bit input data comprises the RLL(2,25) codes of 13-bit channel data whose most significant bit is "1" corresponding to the 7-bit input data among the codes in the first RLL(2,25) code table.

15. The channel coding method as claimed in claim 12, wherein each of the RLL(2,25) codes of the second run length limited RLL(2,25) code table is the 13-bit channel data having a least significant bit of "1," and each of the RLL(2,25) codes of the third run length limited RLL(2,25) code table is the next 13-bit channel data having two most significant bits of "00."

16. The channel decoding method as claimed in claim 12, wherein said step (f) comprises the steps of:

determining whether a least significant bit of the first 13-bit channel data has a predetermined binary value "1;"

determining that the 26-bit channel data has been channel-coded using the second and third run length limited RLL(2,25) code tables if the least significant bit has the predetermined binary value "1;" and determining that the 26-bit channel data has not been channel-coded using the second and third run length limited RLL(2,25) code tables if the least significant bit has predetermined binary value "0."

* * * * *